(12) United States Patent
Ge et al.

(10) Patent No.: US 7,564,266 B2
(45) Date of Patent: Jul. 21, 2009

(54) LOGIC STATE CATCHING CIRCUITS

(75) Inventors: Shaoping Ge, Morrisville, NC (US); Chiaming Chai, Chapel Hill, NC (US); Jeffrey Herbert Fischer, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 11/767,740

(22) Filed: Jun. 25, 2007

(65) Prior Publication Data

US 2008/0315919 A1     Dec. 25, 2008

(51) Int. Cl.
*H03K 19/096*     (2006.01)
(52) U.S. Cl. .................. 326/95; 326/98; 326/9
(58) Field of Classification Search ............... 326/9–13, 326/93, 95, 98; 327/51, 206–212
See application file for complete search history.

(56) References Cited

U.S. PATENT DOCUMENTS

| | | | |
|---|---|---|---|
| 5,124,568 A | | 6/1992 | Chen et al. |
| 5,434,519 A | * | 7/1995 | Trinh et al. ............... 326/83 |
| 5,461,331 A | * | 10/1995 | Schorn ........................ 326/83 |
| 5,926,487 A | * | 7/1999 | Chappell et al. ............ 714/731 |
| 6,104,211 A | * | 8/2000 | Alfke .......................... 326/91 |
| 6,476,645 B1 | * | 11/2002 | Barnes ......................... 327/51 |
| 6,697,929 B1 | * | 2/2004 | Cherkauer et al. ............. 712/1 |
| 2003/0042933 A1 | * | 3/2003 | Hill et al. ..................... 326/95 |

OTHER PUBLICATIONS

International Search Report—PCT/US08/068395—International Search Authority, European Patent Office—Oct. 1, 2008.
Written Opinion—PCT/US08/068395—International Search Authority, European Patent Office—Oct. 1, 2008.

* cited by examiner

*Primary Examiner*—Vibol Tan
(74) *Attorney, Agent, or Firm*—Nicholas J. Pauley; Peter M. Kamarchik; Sam Talpalatsky (57) ABSTRACT

A number of logic state catching circuits are described which use a logic circuit with a first input, a second input, and an output. The logic circuit is configured to respond to a change in state of a data value coupled to the first input causing a representative value of the data value to be generated on the output. The second input receives a latched version of the data value to hold the representative value on the output after the data value has returned to its original state. A latching element is configured to respond to the change in state of the data value by latching the data value and to couple the latched version of the data value to the second input. A reset element is configured to respond to a change in state of a clock input by resetting the latching element.

19 Claims, 8 Drawing Sheets

LOGIC STATE CATCHING CIRCUITS

FIELD OF THE DISCLOSURE

The present disclosure relates generally to the field of integrated circuits and processing systems, and more specifically, to zero and one catcher circuits.

BACKGROUND

Many portable products, such as cell phones, laptop computers, personal data assistants (PDAs) or the like, utilize a processor executing programs, such as, communication and multimedia programs. The processing system for such products includes a processor complex for processing instructions and data. The functional complexity of such portable products, other personal computers, and the like, requires high performance processors and memory. At the same time, portable products have limited energy sources in the form of batteries and provide high performance levels at reduced power levels to increase battery life. Many personal computers being developed today also are being designed to provide high performance at low power drain to reduce overall energy consumption.

Internal to the processor complex, memory elements, logic gates, and latches are used with increasing density as functionality, display density, storage density, and support for new communication and media compression standards grows. For example, many processors use long execution pipelines to achieve giga-hertz clock rates. Each stage in the execution pipeline requires a large plurality of latches as large data buses and instruction buses are latched at each pipeline stage.

Memory elements, such as register files, used in mobile devices require both high speed and low power consumption. For example, dynamic logic technology is used in register files for read access due to its speed advantage. Dynamic circuits use a precharge and a data evaluation phase to determine an output value. Due to the dynamic transitory nature of data read from dynamic logic elements, latches are used to hold the evaluated data values available on dynamic read bit lines. A hold latch, which favors catching logic zero values without using a clock signal, is generally termed a zero catcher. For example, a standard latch may use cross-coupled inverters to perform the following functions including to catch a logic level, to hold the logic level, and drive the logic level to succeeding logic stages. Such a standard latch may use excessive power when attempting to transition a held logic level to a different logic level. Since the output of the cross-coupled inverters may drive long wires or a plurality of loads, the transition power drain can be unacceptably large.

SUMMARY

The present disclosure recognizes that reducing power requirements in a processor complex is important to portable applications and in general for reducing power use in processing systems. It is also recognized that circuits need to be devised to provide high performance and low power. To such ends, an embodiment of the invention addresses a logic state catcher circuit having a logic circuit with a first input, a second input, and an output. The logic circuit is configured to respond to a change in state of a data value coupled to the first input causing a representative value of the data value to be generated on the output. The second input path receives a latched version of the data value to hold the representative value on the output after the data value has returned to its original state. A latching element is configured to respond to the change in state of the data value by latching the data value and to couple the latched version of the data value to the second input. A reset element is enabled by the data value when the data value changes state, and the enabled reset element is configured to respond to a change in state of a clock input by resetting the latching element.

Another embodiment addresses a method for catching a logic state. A latching element of a logic state catching circuit is reset during a predefined period. Within one stage of logic, a change in state of a data-in signal is driven on an output of the logic state catching circuit. The latching element latches the logic state of the data-in signal in response to the change in state of the data-in signal. An output of the latching element is used to hold the output state of the output of the logic state catching circuit.

A further embodiment addresses a logic state catching circuit having a logic circuit with a first input, a second input, and an output. The logic circuit is configured to respond to a change in state of a data value coupled to the first input causing a representative value of the data value to be generated on the output. The second input receives a latched version of the data value to hold the representative value on the output after the data value has returned to its original state. A latching element is configured to respond to the change in state of the data value by latching the data value and to couple the latched version of the data value to the second input. A reset element is configured to hold the latching element in a reset state until a clock changes state allowing the latching element to respond to the change in state of the data value.

Logic state catching circuits which combine high speed logic state catching ability, holding functionality, and power saving features are addressed in further detail below.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the present invention. Accordingly, the drawings and detailed description are to be regarded as illustrative in nature and not as restrictive.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well known structures and components are shown in block diagram form in order to avoid obscuring the concepts of the present invention.

Figure 1:
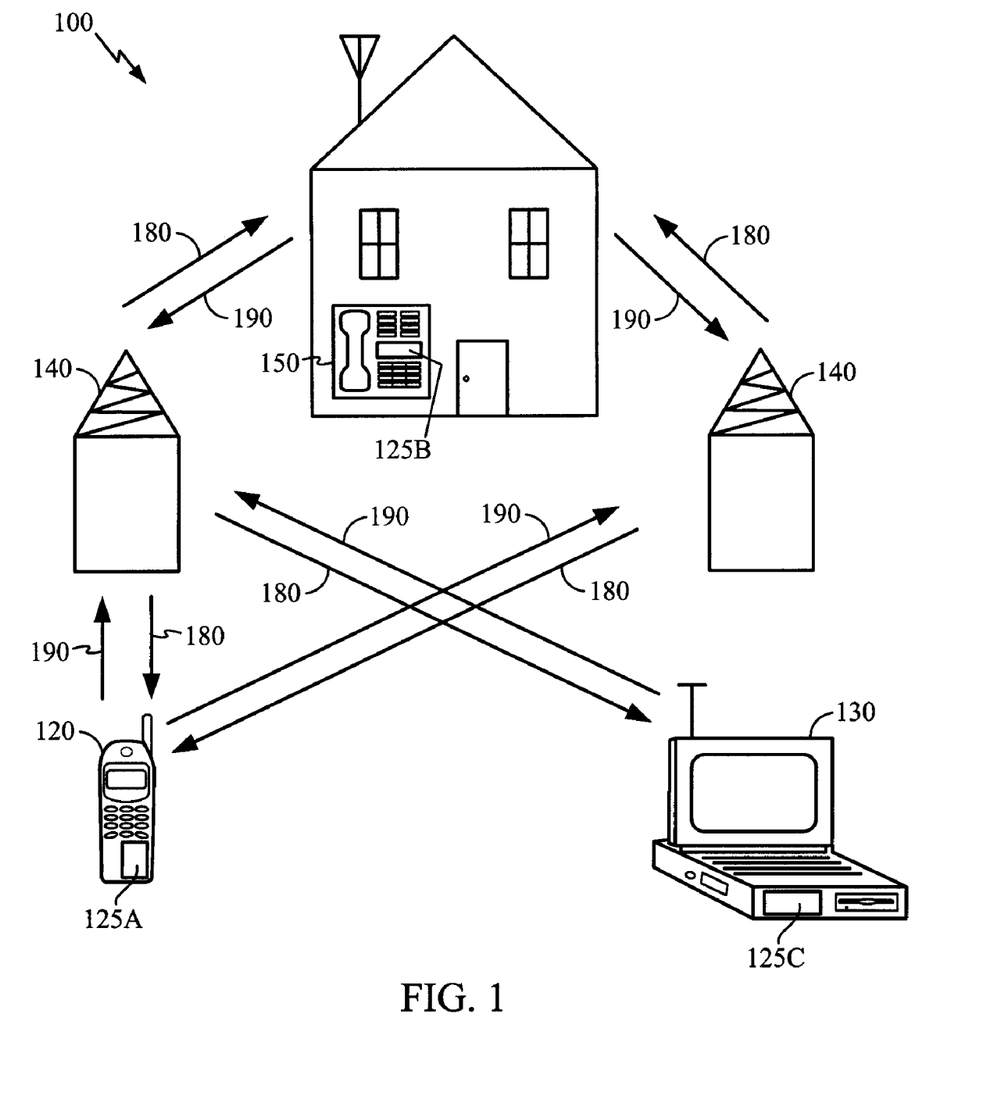
FIG. 1 illustrates a wireless communication system.

FIG. 1 illustrates an exemplary wireless communication system 100 in which an embodiment of the invention may be advantageously employed. For purposes of illustration, FIG. 1 shows three remote units 120, 130, and 150 and two base stations 140. It will be recognized that common wireless communication systems may have many more remote units and base stations. Remote units 120, 130, and 150 include hardware components, software components, or both as represented by components 125A, 125C, and 125B, respectively, which have been adapted to embody the invention as discussed further below. FIG. 1 shows forward link signals 180 from the base stations 140 to the remote units 120, 130, and 150 and reverse link signals 190 from the remote units 120, 130, and 150 to the base stations 140.

In FIG. 1, remote unit 120 is shown as a mobile telephone, remote unit 130 is shown as a portable computer, and remote unit 150 is shown as a fixed location remote unit in a wireless local loop system. By way of example, the remote units may alternatively be cell phones, pagers, walkie talkies, handheld personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. Embodiments of the invention may be suitably employed in any device having dynamic logic, such as a pipelined processor and its supporting peripheral devices.

Figure 2:
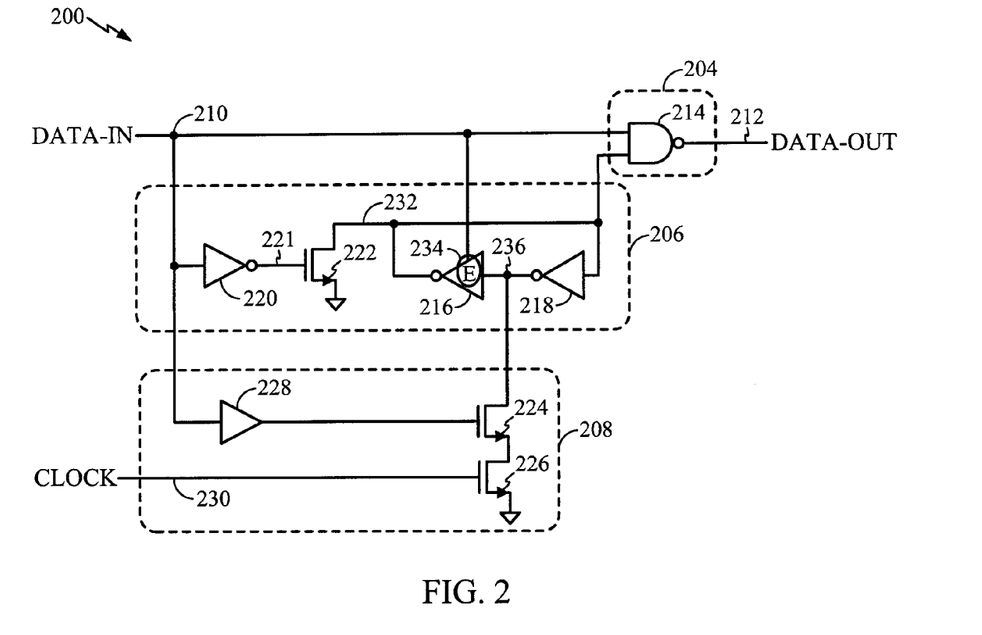
FIG. 2 is a circuit diagram of a first embodiment of a zero catcher circuit.

FIG. 2 is a circuit diagram of a first embodiment of a zero catcher circuit 200. The exemplary zero catcher circuit 200 is comprised of a data output stage 204, a latching element 206, and a reset element 208. The data output stage 204 is coupled with the latching element 206, which is further coupled with the reset element 208. The zero catcher circuit 200 is designed for catching a high-to-low transition of a data-in signal 210 and providing a fast signal path through the data output stage 204 to data-out signal 212 regardless of the state of the clock signal 230. The data output stage 204 advantageously uses a single logic gate element, such as a logic NAND gate 214, which may be advantageously designed with respect to various factors, such as performance and fan out loading to the next stage of logic. It is appreciated that depending upon the requirements of the next stage of logic, the logic NAND gate 214 may be implemented with other logic functions, such as an AND gate, for example. The latching element 206 comprises a tristate inverter 216 and inverter 218 in a cross-coupled latch arrangement. The cross-coupled inverters 216 and 218 are controlled to hold a zero value as a result of the high-to-low transition on the data in signal 210 through the use of inverter 220 and transistor 222. The cross-coupled inverters 216 and 218 do not directly drive the data-out signal 212 of the zero catcher circuit 200 and may be advantageously designed with respect to various factors, such as timing of state changing events, device performance, and device physical implementation size. The reset element 208 comprises two serially coupled transistors 224 and 226 that respond to the data-in signal 210, buffered by buffer device 228, and to a clock signal 230, respectively. The reset element 208 is also separate from the output driving stage of the zero catcher circuit 200 and may be advantageously designed with respect to various factors, such as timing of state changing events, device performance, power, and device physical implementation size.

In operation, the data-in signal 210 is normally at a high-level value which, during a data evaluation period, may transition from the high-level value to a low-level value and then return to the high-level value. Such a pulse indicates the presence of a zero on the data-in signal 210. It is assumed that initially, prior to the start of the data evaluation period, the data-out signal 212 is at a low-level which implies that both inputs, data-in signal 210 and data-H signal 232, to NAND gate 214 are at a high level. When the data-in signal 210 makes the high-level to low-level transition, the NAND gate 214 output data-out signal 212 transitions to a high level value. The delay from the data-in signal 210 changing state to the data-out signal 212 changing state is due to the delay of the NAND gate 214 and loading on the data-out signal 212. For example, a 65 nanometer (nm) technology may be used to implement the zero catcher circuit 200 and in such technology a NAND gate may have a delay in the range of 40 to 70 picoseconds (ps) driving an average fan-out of four loads. The data output stage 204 represents a fast path to provide the zero value to the data-out signal 212.

The data-in signal's 210 transition to a zero is for a short duration pulse and the data must be latched for a longer period of time for logic in succeeding stages to properly respond to the input value. The latching element 206 provides a holding function to hold the state of the data-out signal 212. While the data-in signal 210 is at the low-level, the inverter 220 responds driving transistor 222 "ON" which brings the data-H signal 232 to a low value. Also, the low value of the data-in signal 210 controls the tristate enable input 234 which places the tristate inverter 216 into a high impedance output state. This high impedance state allows the output of the tristate inverter 216 to be easily driven to the low value by transistor 222 with minimum power drain in making the transition. The low level on the data-H signal 232 causes the output of inverter 218, data-L signal 236, to transition to a high level. After a short period, the data-in signal 210 transitions back to a high level to re-enable the tristate inverter 216. The tristate inverter 216 responds to the data-L signal 236 at a high level to maintain the low level on its output data-H signal 232 which thereby latches the zero in latching element 206 and holds the zero on the input to the NAND gate 214. The data-out signal 212 is thereby held until the next time when both data-in and clock are "one" after the data-in signal 210 has returned to its initial level.

To allow the zero catcher to respond to the next data-in signal 210 value, the reset element 208 is enabled during a predefined period as controlled by the clock signal 230. With the data-in signal 210 at a high level, the buffer device 228 drives transistor 224 on and when the clock signal 230 transitions to a high level the transistor 226 turns on bringing the data-L signal 236 to a low level. The cross coupled inverters 216 and 218 transition to hold a one level enabling the NAND gate 214 to follow the next value on the data-in signal 210.

Figure 3:
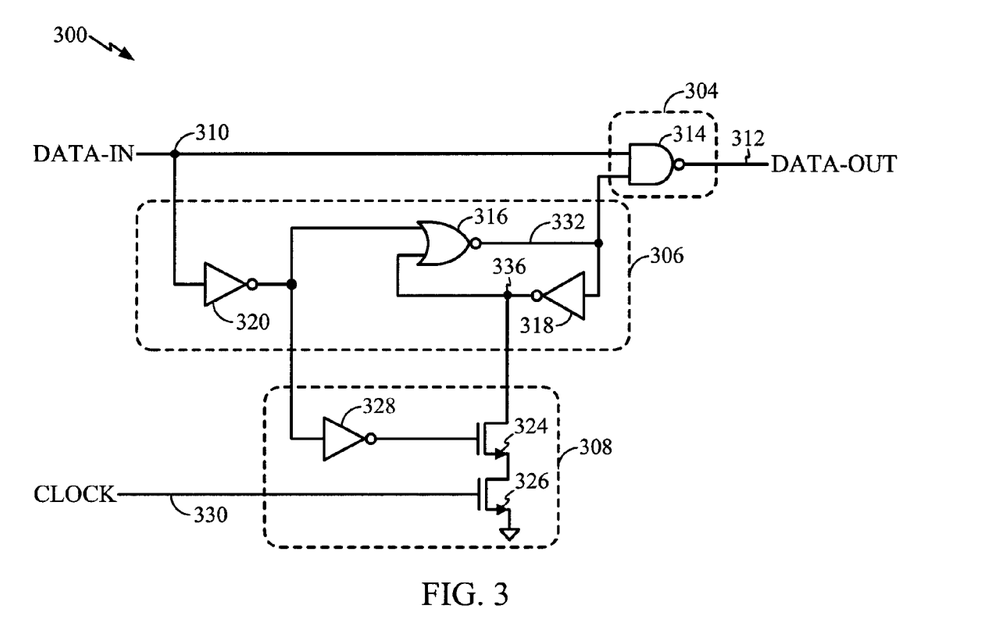
FIG. 3 is a circuit diagram of a second embodiment of a zero catcher circuit.

FIG. 3 is a circuit diagram of a second embodiment of a zero catcher circuit 300. The exemplary zero catcher circuit 300 is comprised of a data output stage 304, a latching element 306, and a reset element 308. The data output stage 304 is coupled with the latching element 306 and further coupled with the reset element 308. The zero catcher circuit 300 is designed for catching a high-to-low transition of a data-in signal 310 and providing a fast signal path through the data output stage 304 to data-out signal 312. The data output stage 304 advantageously uses a single logic gate element, such as a logic NAND gate 314, which may be advantageously designed with respect to various factors, such as performance and fan out loading to the next stage of logic. It is appreciated that depending upon the requirements of the next stage of logic, the logic NAND gate 314 may be implemented with other logic functions, such as an AND gate, for example. The latching element 306 comprises a two input NOR gate 316 and inverter 318 in a cross-coupled latching arrangement. The cross-coupled latch represented by the NOR gate 316 and the inverter 318 is controlled to hold a zero value as a result of the high-to-low transition on the data in signal 310 through the use of inverter 320. Since the NOR gate 316, the inverter 318, or the inverter 320 do not directly drive the data-out signal 312, they may be advantageously designed with respect to various factors, such as timing of state changing events, device performance, and device physical implementation size. The reset element 308 comprises two serially coupled transistors 324 and 326 that respond to the data-in signal 310, buffered by inverters 320 and 328, and to a clock signal 330, respectively. The reset element 308 is also separate from the output driving stage of the zero catcher circuit 300 and may be advantageously designed with respect to various factors, such as timing of state changing events, device performance, and device physical implementation size.

By having the data output stage 304, the latching element 306, and the reset element 308 as separate elements of the zero catcher circuit 300 of FIG. 3, the physical size of the individual devices of the zero catcher circuit 300 may be advantageously designed for their intended functions without affecting performance of the zero catcher circuit 300. For example, the data output stage 304 consists of a NAND gate 314 which is sized according to the data-out signal 312 fan-out and performance requirements. As a reference point, the NAND gate 314 may be sized in a low power 65 nm CMOS technology based on a fan-out of 4 standard logic loads and relatively short wire lengths. It is further assumed that high performance is required, with the zero catcher circuit responding with correct operation to, as an example, a data-in signal 310 minimum pulse width of 150 picoseconds. It is further assumed that the devices located within the latching element 306 and the reset element 308 are placed in close proximity to each other and that the data output stage 304, the latching element 306, and reset element 308 are closely located together.

Since neither the NOR gate 316, the inverter 318, or the inverter 320 of latching element 306 directly drive the data-out signal 312, the devices may be sized according to the latching function they provide. In the reference point example, the NOR gate 316, the inverter 318, and the inverter 320 may be sized relative to the size of the NAND gate 314. For example, the NOR gate 316, the inverter 318, and the inverter 320 may be approximately 0.2×, 0.1×, and 0.1×, respectively, the size of the NAND gate 314 and provide a correct latching function. In a similar manner, the reset element 308, being separate, may be sized according to its function. For example, the transistor 324, since it will be "fighting" the output of inverter 318 during a reset operation, is sized to be approximately three times (3×) the size of inverter 318 or approximately 0.3× the size of NAND gate 314. The inverter 328 which drives the transistor 324 need not be as large and may be one half (0.5×) the size of inverter 318 or approximately 0.05× the size of NAND gate 314. The transistor 326 is sized the same as the transistor 324 to provide the same current carrying capacity. These relative device sizes are provided as an example to indicate the advantageous design sizes which may be achieved by separating the function of a zero catcher circuit into a data out stage, a latching element, and a reset element, such as the zero catcher circuit 300. It is also noted that such physical design improvements further enhance the performance of the zero catcher and reduce its power utilization.

Further operational details of the zero catcher circuit 300 are described in detail below with respect to FIGS. 4 and 5 and timing diagrams 400 and 500, respectively. The description of signal timing events in the timing diagrams 400 and 500 includes reference numbers to the circuit elements in FIG. 3 and includes time reference markings in 200 picoseconds (ps) or 0.2 nanosecond (ns) intervals. A timing event is considered to begin once a signal transition crosses the logic threshold of a device used in an implementation technology. The representative timings and response times of components shown are exemplary of a high performance implementation technology.

Figure 4:
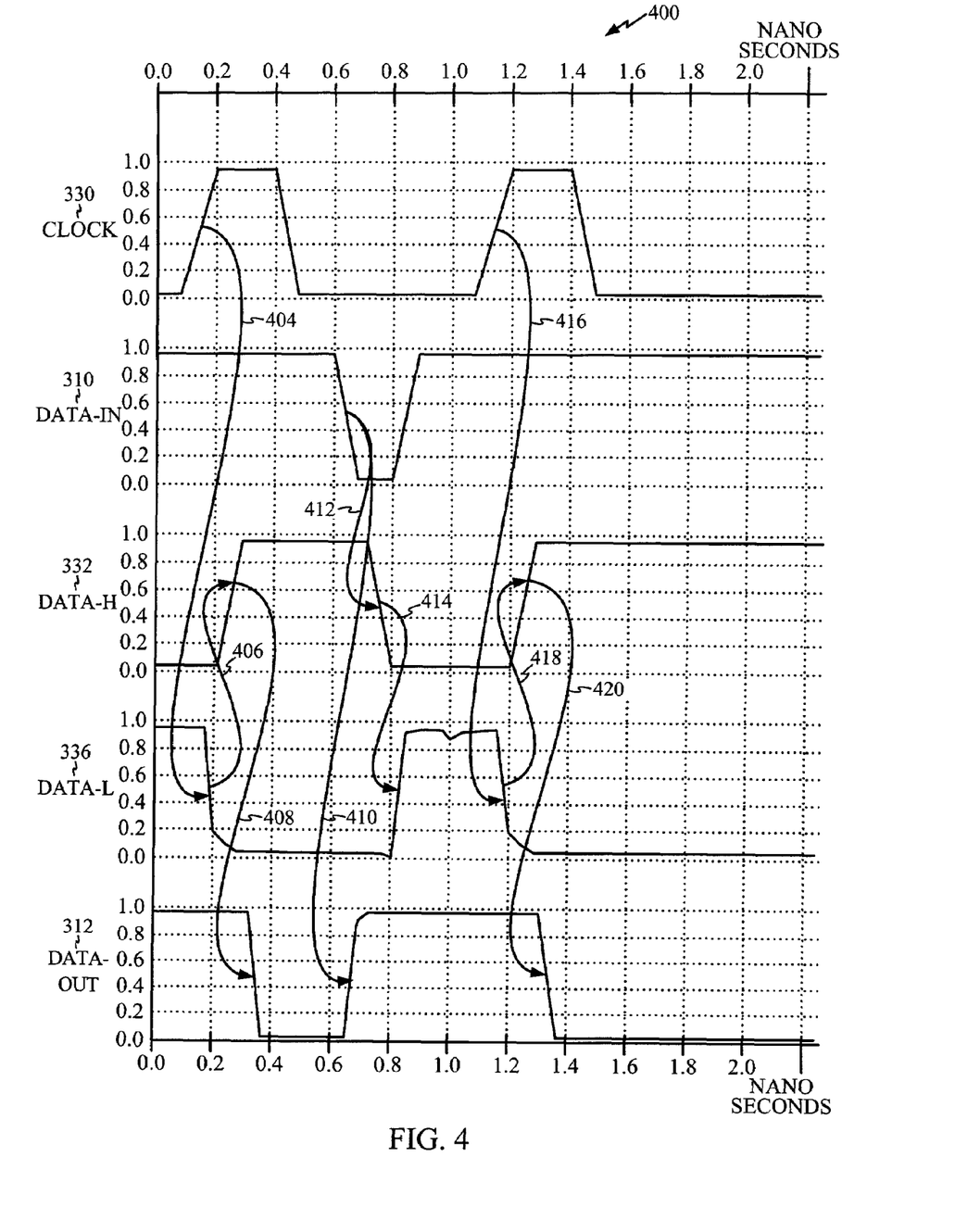
FIG. 4 is a timing diagram illustrating a first sequence of timing events in the operation of the zero catcher circuit of FIG. 3.

Beginning with the timing diagram 400 of FIG. 4, a first sequence of events in the operation of the zero catcher circuit 300 of FIG. 3 is illustrated. At time 0.0, the clock signal 330 and the data-H signal 332 are at a low signal value and the data-in signal 310, data-L signal 336, and data-out signal 312 are at a high level. At timing event 404, the clock signal 330 has transitioned to a high level causing data-L signal 336 to be driven down to a low level. The change in state of the data-L signal 336 is due to transistor 324 already being on and the clock signal 330 driving transistor 326 "ON". At timing event 406, the data-L signal 336 has transitioned to low level causing the data-H signal 332 to be driven to a high level, since the two inputs to the NOR gate 316 will be low. At timing event 408, the data out signal 312 is driven to a low level since both inputs to the NAND gate 314 are at a high level.

At timing event 410, the data-in signal 310 changes state to a low level causing the data-out signal 312 to transition to a high level. At timing event 412, the change in state of the data-in signal 310 causes the data-H signal 332 to transition to a low level. At timing event 414, the change in state of the data-H signal 332 causes the data-L signal 336 to transition to a high level, which advantageously latches the zero value of the data-in signal 310 in the latching element 306. The data-out signal 312 remains at the latched zero value, inverted due to the NAND gate 314, even while the data-in signal 310 returns to a high level as is illustrated at the 1.0 nanosecond mark in FIG. 4.

At timing event 416, the clock signal 330 transitions to a high level causing the data-L signal 336 to transition to a low level. At timing event 418, data-L signal 336 has transitioned to low level causing data-H signal 332 to be driven to a high level, since the two inputs to the NOR gate 316 will be low. At timing event 420, the data out signal 312 is driven to a low level since both inputs to the NAND gate 314 are at a high level. With the clock signal 330 returning to a low level, the reset for the cross-coupled inverters is completed and the zero catcher circuit 300 is prepared to catch the next zero state of the data-in signal 310.

It is noted that the data-out signal 312 has a pulse, beginning at the falling edge of the data-out signal 312 from the timing event 408 to the timing event 410 rising edge of the data-out signal 312, that is due to the affects of reset and a following high-to-low transition at the data-in signal. It is further noted that such a pulse of the data-out signal 312 may be advantageously minimized or avoided by controlling the clock signal 330 as illustrated in FIG. 5.

Figure 5:
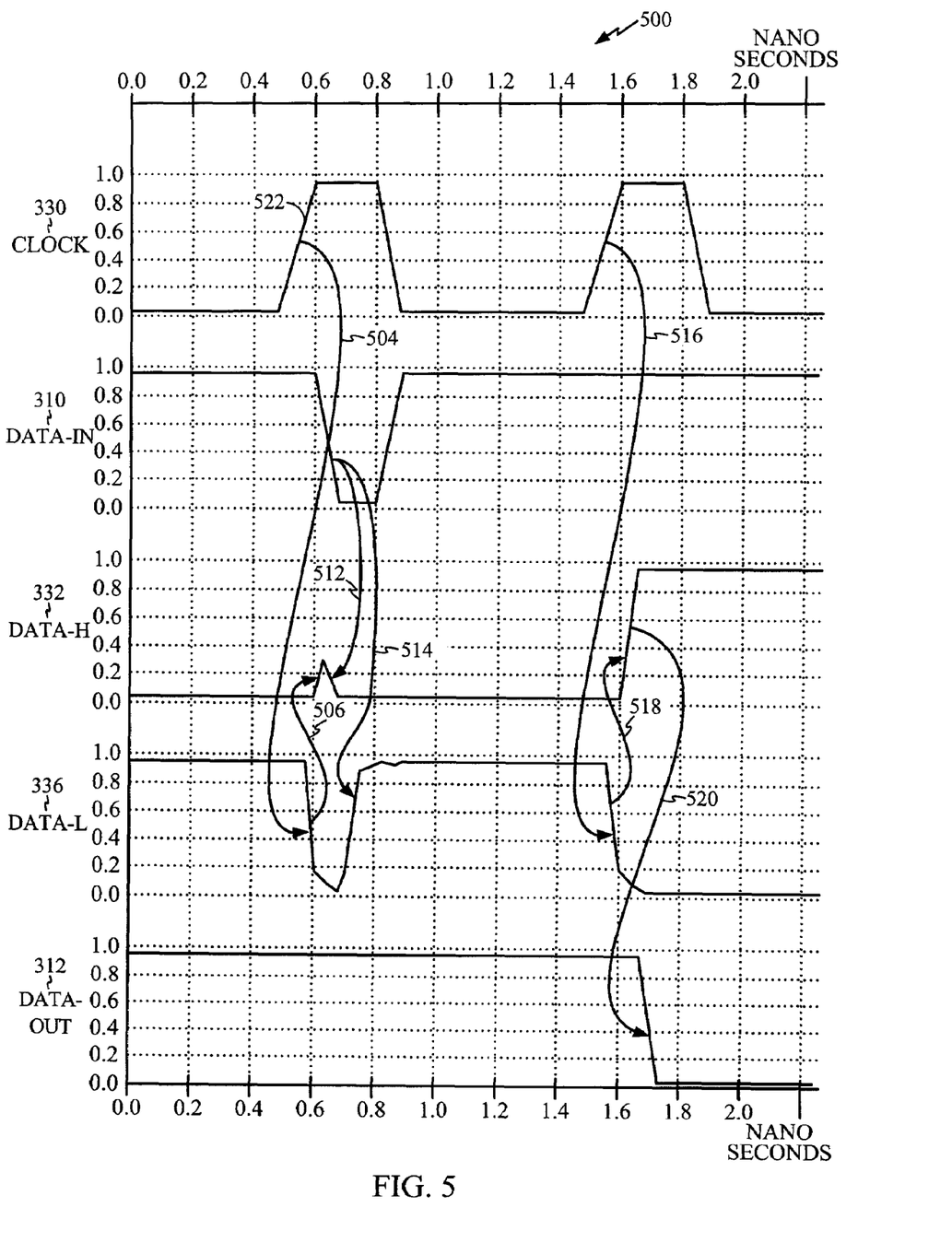
FIG. 5 is a timing diagram illustrating a second sequence of timing events in the operation of the zero catcher circuit of FIG. 3.

FIG. 5 is a timing diagram illustrating a second sequence of timing events in the operation of the zero catcher circuit 300 of FIG. 3. In a similar manner to the description of the timing diagram of FIG. 4, the description of signal timing events in the timing diagram 500 includes reference numbers to the circuit elements in FIG. 3.

At time 0.0, the clock signal 330 and the data-H signal 332 are at a low signal value and the data-in signal 310, data-L signal 336, and data-out signal 312 are at a high level. Due to the separate latching element 306 and reset element 308, the clock signal 330 may be delayed to minimize or avoid the transition in the data-out signal 312 that occurred between timing events 408 and 410 in FIG. 4. The clock signal 330 is controlled to closely match the timing of a change in state of the data-in signal 310. At timing event 504, the clock signal 330 has transitioned to a high level causing data-L signal 336 to be driven down to a low level. The change in state of the data-L signal 336 is due to transistor 324 already being on and the clock signal 330 driving transistor 326 on. At timing event 506, data-L signal 336 has transitioned to low level causing data-H signal 332 to begin to be driven to a high level, since the two inputs to the NOR gate 316 will be low. At timing event 512, which occurs a short while after timing event 506 due to the optimized timing between the delayed clock and data-in signal, the change in state of the data-in signal 310 causes the data-H signal 332 to transition back to a low level. At timing event 514, the change in state of the data-in signal 310 causes the data-L signal 336 to transition to a high level, which advantageously latches the zero value of the data-in signal 310 in the latching element 306. The data-out signal 312 remains at the latched zero value, inverted due to the NAND gate 314, even while the data-in signal 310 returns to a high level as is illustrated at the 1.0 nanosecond mark in FIG. 5. It is noted that no transition of the data-out signal 312 occurs during this reset period due to the delayed clock signal 330. Such reduction of transitions saves power in a system having a plurality of zero catcher circuits. It is appreciated that circuit analysis techniques are used to ensure correct operation within best-case to worst-case timing scenarios for a particular implementation.

Continuing at timing event 516, the clock signal 330 transitions to a high level causing the data-L signal 336 to transition to a low level. At timing event 518, data-L signal 336 has transitioned to low level causing data-H signal 332 to be driven to a high level, since the two inputs to the NOR gate 316 will be low. At timing event 520, the data out signal 312 is driven to a low level since both inputs to the NAND gate 314 are at a high level. With the clock signal 330 returning to a low level, the reset period is completed and the zero catcher circuit 300 is prepared to catch the next zero state of the data-in signal 310.

Figure 6:
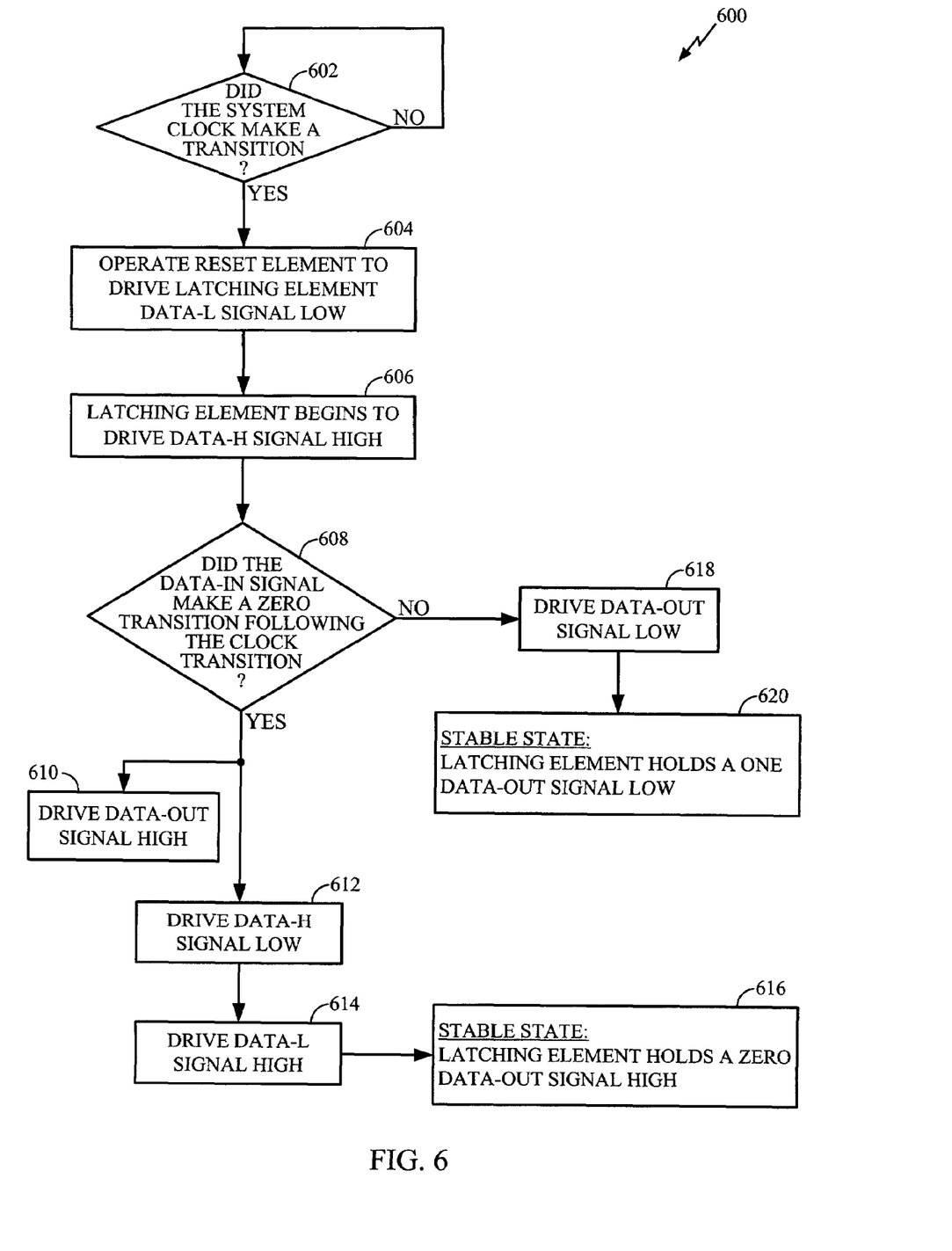
FIG. 6 illustrates an exemplary sequence of timing events in catching a zero in the zero catcher circuit of FIG. 3.

The zero catcher circuit 300 of FIG. 3 has data-in signal 310 and clock signal 330 as two input signals and data-out signal 312 as a single output signal. When a transition occurs on either of the two inputs, a sequence of timing events follows that determines the zero catcher circuit's operation. FIG. 6 illustrates an exemplary sequence of timing events in catching a zero in the zero catcher circuit 300 of FIG. 3. It is appreciated that the timing of signals with respect to other signals in a system and the time a signal takes to transition from one state to another state may vary depending upon the implementation technology and the particular design in which signals will have varying numbers of fan-outs and wire lengths. Within the tolerances and specifications of the implementation technology and design, such variations may be accounted for and do not preclude correct operation of the various embodiments of the zero catcher circuits.

The initial state of the data-in signal 310 is high and the initial state of the clock signal 330 is low. Also, the clock signal 330 is delayed appropriately to closely match the timing of a transition on the data-in signal 310, with a transition of the clock signal 330 occurring prior to a transition of the data-in signal 310. It is noted that a clock signal 330 transition, such as transition 522, generally occurs prior to the data-in signal 310 being evaluated to ensure the latching element 306 is reset. This timing sequence allows the latching element 306 to change state if required according to the state of the data-in signal 310. A high-to-low transition on the data-in signal 310, without a preceding clock signal transition to reset the latching element 306, would be caught in the zero catcher circuit. If the data-in signal 310 maintained a one level at the evaluation time without a preceding clock signal transition to reset the latching element 306, the one level would not be caught in the zero catcher circuit if it previously held a zero.

FIG. 6 illustrates an exemplary sequence of timing events under normal operation with a clock signal preceding the data evaluation period. A timing event is considered to begin once a signal transition crosses the logic threshold of a device used in an implementation technology. At block 602, a determination is made whether the clock signal 330 made a transition, such as, in this case, a rising transition. If no transition of the clock signal 330 occurred, the zero catcher circuit 300 remains in a stable state and waits for a transition of the clock signal 330. If a transition of the clock signal 330 occurred, then the process 600 proceeds to block 604. At block 604, the reset element 308 is operated to drive latching element data-L signal 336 low. Block 604 is comparable to timing events 504 and 516. At block 606, the latching element 306 begins to drive data-H signal 332 high. Block 606 is comparable to timing events 506 and 518.

At block 608, a determination is made whether the data-in signal 310 made a falling transition following the clock signal transition. If a falling transition was made, then the process 600 proceeds to blocks 610 and 612. At block 610, the data-out signal 312 is driven high indicating a zero. At block 612, the data-H signal 332 is driven low. Block 612 is comparable to timing event 512. In such manner, a transition of the data-out signal 312, such as associated with timing events 408 and 410 of FIG. 4, is avoided, thereby saving power. At block 614, the data-L signal 336 is driven high. Block 614 is comparable to timing event 514. At block 616, a stable state is reached with the latching element 306 holding a zero and the data-out signal 312 at a high level. As indicated above, a high level on the data-out signal 312 indicates a zero due to the use of the NAND gate 314.

Returning to block 608, if the data-in signal 310 did not make a zero transition following the clock signal transition, then the process 600 proceeds to block 618. At block 618, the data-out signal 312 is driven low. Block 618 is comparable to timing event 520. At block 620, a stable state is reached with the latching element 306 holding a one and the data-out signal 312 at a low level. As indicated previously, a low level indicates a one due to the use of the NAND gate 314.

Figure 7A:
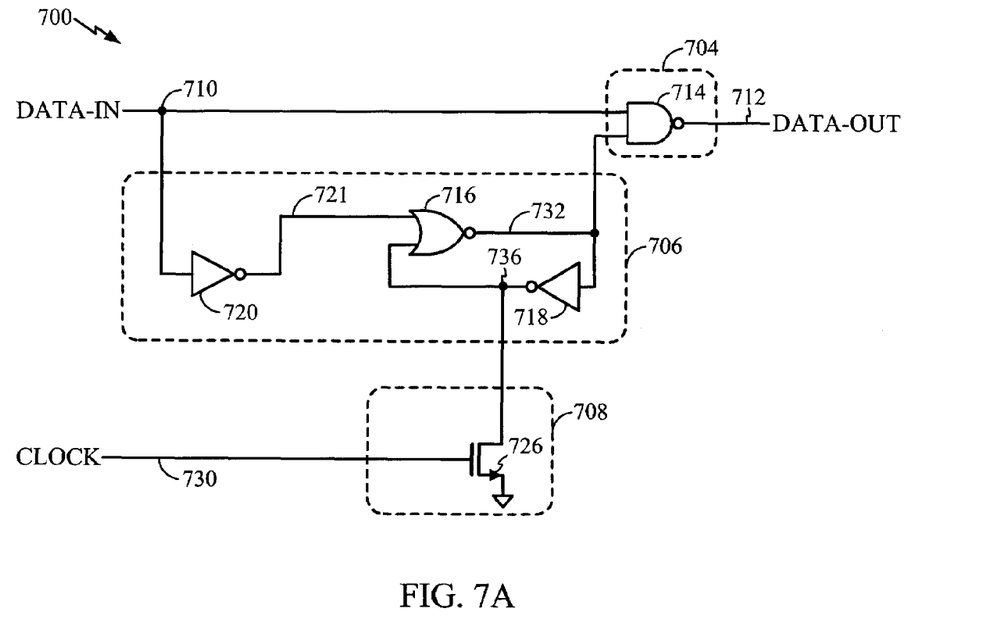
FIG. 7A is a circuit diagram of a third embodiment of a zero catcher circuit.

Another embodiment of a zero catcher circuit may be used to provide improved area and power savings if the timing relationship of the data-in signal 310 and the clock 330 may be controlled, as described below with regards to FIGS. 7A and 7B. FIG. 7A is a circuit diagram of a third embodiment of a zero catcher circuit 700. The zero catcher circuit 700 has a data output stage 704, a latching element 706 and a reset element 708. The zero catcher 700 is similar to the zero catcher circuit 300 of FIG. 3 except for the reset element 708, which does not require the use of an inverter, such as inverter 328, or a transistor, such as the transistor 324. The data output stage 704 and latching element 706 operate in a similar manner to the operation of the data output stage 304 and latching element 306 of FIG. 3.

Figure 7B:
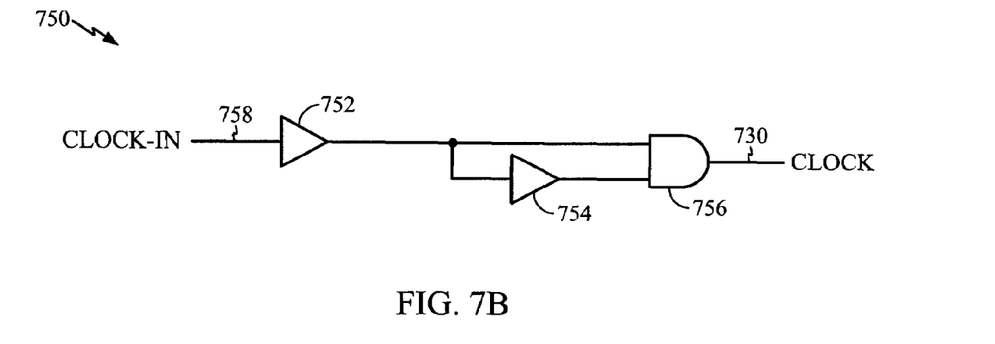
FIG. 7B is an exemplary clock circuit used to provide the clock for the zero catcher circuit of FIG. 7A.

FIG. 7B is an exemplary clock circuit 750 used to provide the clock for the zero catcher circuit of FIG. 7A. The clock circuit 750 controls the timing relationship between the data-in signal 710 and the clock 730. For example, to control the timing relationship, the clock circuit 750 uses a first delay buffer 752, a second delay buffer 754, and AND gate 756. The first delay buffer 752 controls the arrival time of the clock 730 with respect to the data-in signal 710 and the second delay buffer 754 reduces the pulse width of the clock 730. The delay values of the first delay buffer 752 and the second delay buffer 754 are chosen to generate a clock 730 which can guarantee the node 736 is successfully reset, while at the same time reduces the pulse width of the data-L signal 736 by delaying the resetting of the latching element 706. For example, a pulse width, indicated between timing events 506 and 514 of FIG. 5, may be controlled by the clock circuit 750. By controlling such a pulse width, the possibility of generating a glitch on the data-out signal 712 is minimized or eliminated. By careful control of the timing relationship, the pulse width of any glitch which might occur on the data-out signal 712 can also be reduced.

Figure 8:
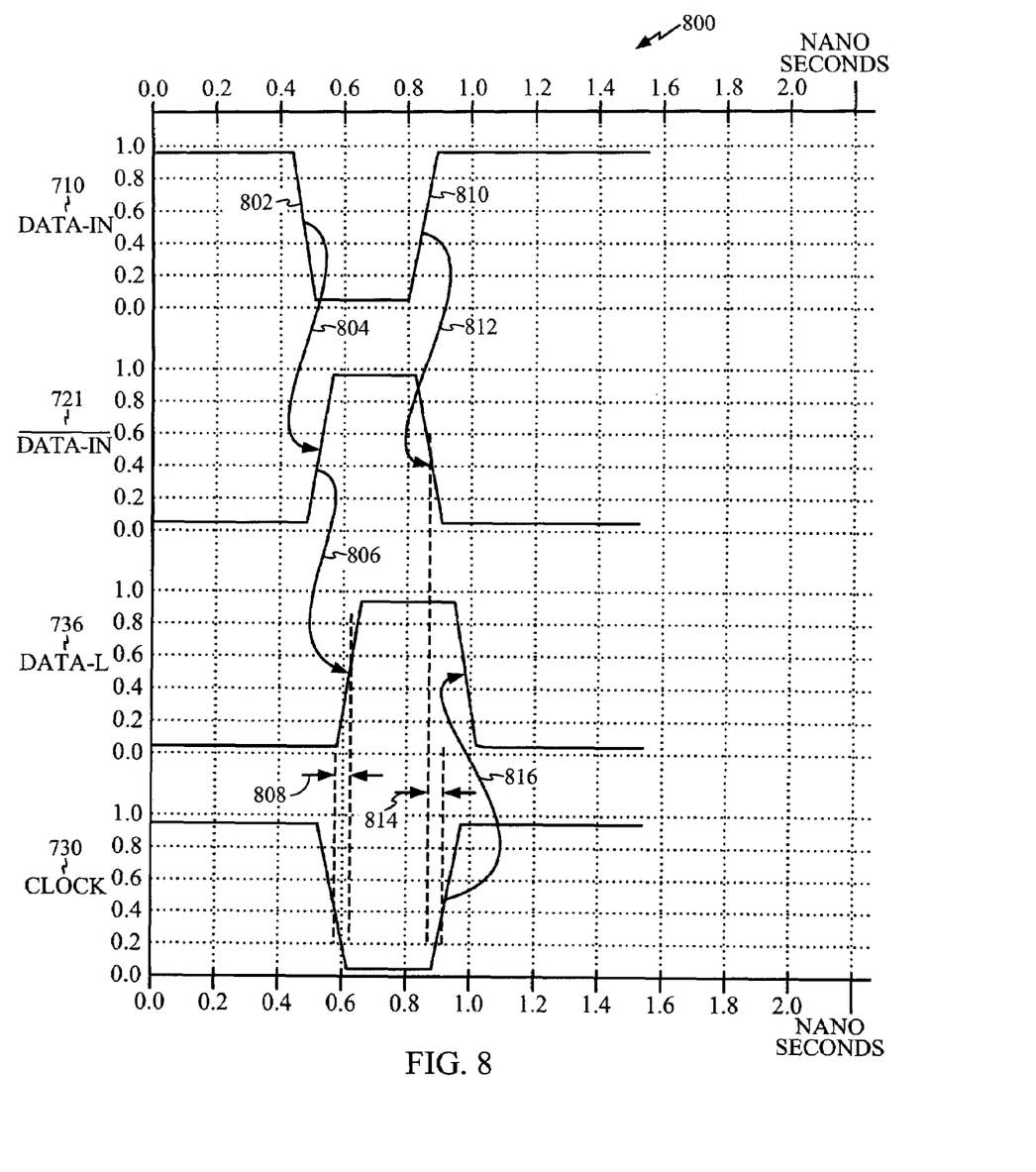
FIG. 8 illustrates a timing diagram supporting the operation of the zero catcher circuit of FIG. 7A and the clock circuit of FIG. 7B.

FIG. 8 illustrates a timing diagram 800 supporting the operation of the zero catcher circuit of FIG. 7A and the clock circuit of FIG. 7B. The timing relationship between the data-in signal 710 and the clock 730 is shown with respect to an internal inverted data-in signal 721 and data-L signal 736. The circuits of FIGS. 7A and 7B are assumed to respond to input signals at a 20% above a ground level or 20% of a supply voltage level. For example, a "0" value would be considered anything less than or equal to 0.2 volts and a "1" value would be considered anything greater than or equal to 0.8 volts for a supply voltage of 1.0 volts. Depending upon technology, a different supply voltage may be used and a response tolerance different than 20% may also be used. For the timing diagram 800 a supply voltage of 1 volt is assumed.

In FIG. 8, the data-in signal 710 arrives at time 802. In response to the arrival of data-in signal 710, the inverted data-in signal 721 is generated at timing event 804. At timing event 806, the data-L signal 736 responds with a rising edge. The clock 730 is controlled such that the falling edge of the clock 730 occurs within a time delay period 808 before the rising edge of data-L signal 736 to disable the transistor 726 allowing the latching element 706 to catch the zero. For example, 40 picoseconds for a low power 65 nm CMOS technology may be used for the time delay period 808. Such a timing specification depend upon the operating corners of the device and may be considered a range of values that provide correct operation. For example, when the device is operating at a primary operating corner, the time delay period 808 of 40 ps is specified to be sufficient to ensure correct operation.

In FIG. 8, the data-in signal 710 returns to a "1" value at time 810. At timing event 812, the inverted data-in signal 721 changes state in response to the change in state of the data-in signal 710. The clock signal is then controlled to return to a "1" value at a time specification greater than or equal to time specification 814. For example, 40 picoseconds for a low power 65 nm CMOS technology may be used for time specification 814. In response to the change in state of the clock 730, the data-L signal 736 is driven by transistor 726 to a "0" level at timing event 816. It is noted that by changing the delay of the second delay buffer 754, the pulse width of the clock 730 may be changed, delaying the rising edge of the clock signal. It is noted that the rising and falling edges of the clock 730 and other signals may vary with voltage, process technology, and other factors such as signal loading. By evaluating an implementation in a specific technology, such as by using analog circuit simulation techniques, the rising and falling edge timing, device delays, and pulse width of the clock can be controlled by use of the clock circuit 750, or the like.

Figure 9:
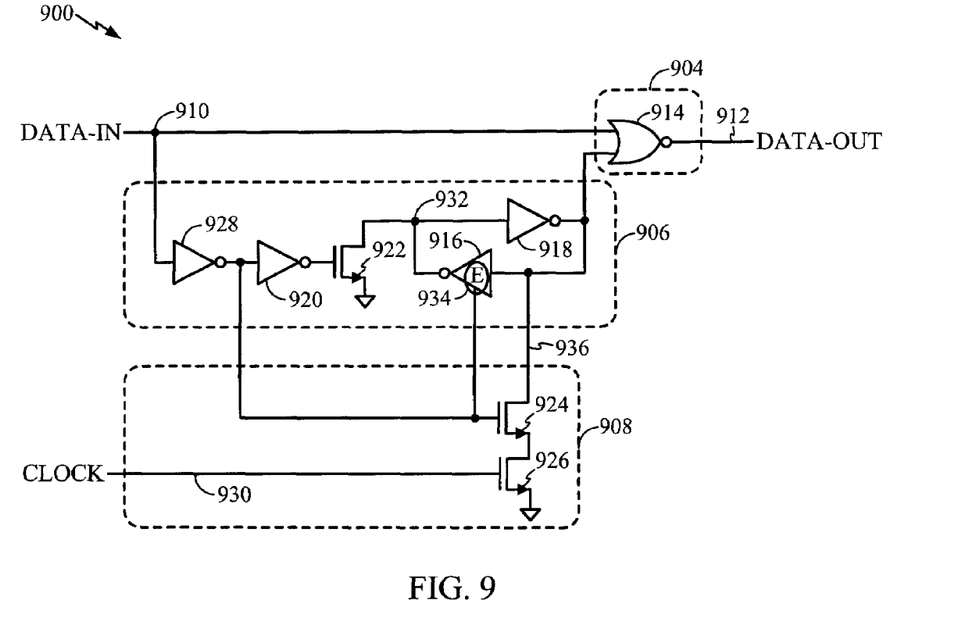
FIG. 9 is a circuit diagram of a first embodiment of a one catcher circuit.

FIG. 9 is a circuit diagram of a first embodiment of a one catcher circuit 900. The exemplary one catcher circuit 900 is comprised of a data output stage 904, a latching element 906, and a reset element 908. The data output stage 904 is coupled with the latching element 906 and further coupled with the reset element 908. The one catcher circuit 900 is designed for catching a low-to-high transition of a data-in signal 910 and providing a fast signal path through the data output stage 904 to data-out signal 912. The data output stage 904 advantageously uses a single logic gate element, such as a logic NOR gate 914, which may be advantageously designed with respect to various factors, such as performance and fan out loading to the next stage of logic. It is appreciated that depending upon the requirements of the next stage of logic, the logic NOR gate 914 may be implemented with other logic functions, such as an OR gate, for example. The latching element 906 comprises a tristate inverter 916 and inverter 918 in a cross-coupled latching arrangement. The cross-coupled inverters 916 and 918 are controlled to hold a one value as a result of the low-to-high transition on the data in signal 910 through the use of inverters 920 and 928 and transistor 922. The cross-coupled inverters 916 and 918 do not directly drive the data-out signal 912 of the one catcher circuit 900 and may be advantageously designed with respect to various factors, such as timing of state changing events, device performance, and device physical implementation size. The reset element 908 comprises two serially coupled transistors 924 and 926 that respond to the data-in signal 910, buffered by inverter 928, and to a clock signal 930, respectively. The reset element 908 is also separate from the output driving stage of the one catcher circuit 900 and may be advantageously designed with respect to various factors, such as timing of state changing events, device performance, and device physical implementation size.

In operation, the data-in signal 910 is normally at a low-level value which during a data evaluation period may transition from the low-level value to a high-level value and then return to the low-level value. Such a pulse indicates the presence of a one on the data-in signal 910. It is assumed that initially prior to the start of the data evaluation period, the data-out signal 912 is at a high-level which implies that both inputs, data-in signal 910 and data-L signal 936, to NOR gate 914 are at a low level. When the data-in signal 910 makes the low-level to high-level transition, the NOR gate 914 output data-out signal 912 transitions to a low level value. The delay from the data-in signal 910 changing state to the data-out signal 912 changing state is due to the delay of the NOR gate 914 and loading on the data-out signal 912. For example, a 90 nanometer (nm) technology may be used to implement the one catcher circuit 900 and in such technology a NOR gate may have a delay in the range of 20 to 40 picoseconds (ps) driving an average fan-out of four loads. The data output stage 904 represents a fast path to providing the one value to the data-out signal 912.

The data-in signal's 910 transition to a one is for a short duration pulse and the one must be latched for a longer period of time for logic in succeeding stages to properly respond to the one value. The latching element 906 provides a holding function to hold the state of the data-out signal 912 to a one value. While the data-in signal 910 is at the high-level, the inverters 920 and 928 respond by driving transistor 922 "ON" which brings the data-H signal 932 to a low value. Also, the high value of the data-in signal 910 inverted by inverter 928 controls the tristate enable input 934 which places the tristate inverter 916 into a high impedance output state. This output state allows the output to be easily driven to the low value by transistor 922 with minimum power drain in making the transition. The low level on the data-H signal 932 causes the output of inverter 918, data-L signal 936, to transition to a high level. After a short period, the data-in signal 910 transitions back to a low level to re-enable the tristate inverter 916. The tristate inverter 916 responds to the data-L signal 936 at a high level to maintain the low level on its output data-H signal 932 which thereby latches the one in latching element 906 and holds the one on the input to the NOR gate 914. The data-out signal 912 is thereby held for a longer period of time after the data-in signal 910 has returned to its initial level.

To allow the one catcher to respond to the next data-in signal 910 value, the reset element 908 is enabled during a predefined period as controlled by the clock signal 930. With the data-in signal 910 at a low level, the inverter 928 drives transistor 924 "ON" and when the clock signal 930 transitions to a high level the transistor 926 turns "ON" bringing the data-L signal 936 to a low level. The cross coupled inverters 916 and 918 transition to hold a zero level enabling the NOR gate 914 to follow the data-in signal 910.

Figure 10:
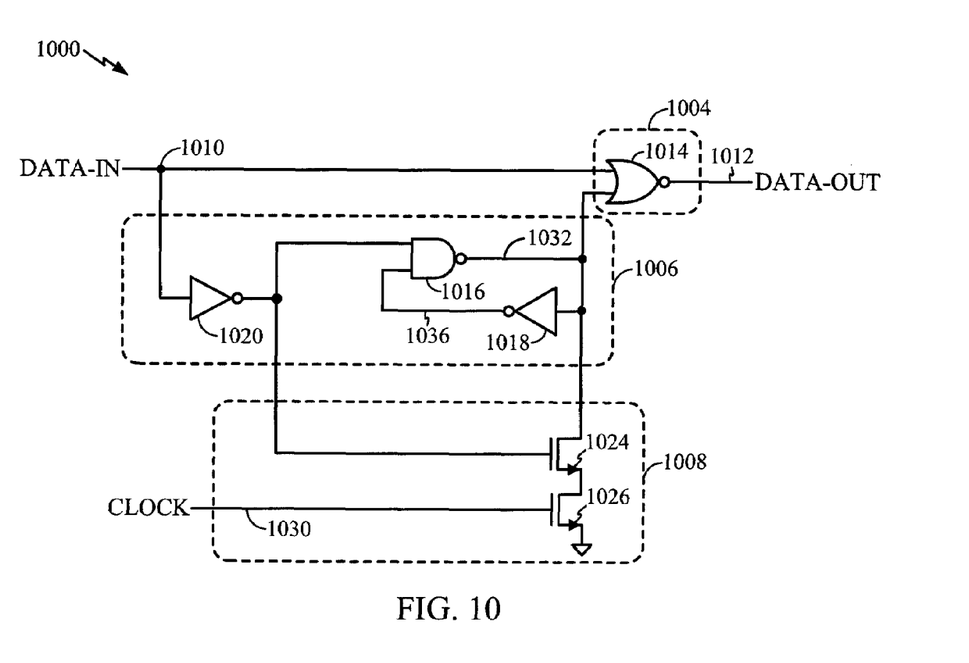
FIG. 10 is a circuit diagram of a second embodiment of a one catcher circuit.

FIG. 10 is a circuit diagram of a second embodiment of a one catcher circuit 1000. The exemplary one catcher circuit 1000 is comprised of a data output stage 1004, a latching element 1006, and a reset element 1008. The data output stage 1004 is coupled with the latching element 1006 and further coupled with the reset element 1008. The one catcher circuit 1000 is designed for catching a low-to-high transition of a data-in signal 1010 and providing a fast signal path through the data output stage 1004 to data-out signal 1012. The data output stage 1004 advantageously uses a single logic gate element, such as a logic NOR gate 1014, which may be advantageously designed with respect to various factors, such as performance and fan out loading to the next stage of logic. It is appreciated that depending upon the requirements of the next stage of logic, the logic NOR gate 1014 may be implemented with other logic functions, such as an OR gate, for example. The latching element 1006 comprises a two input NAND gate 1016 and inverter 1018 in a cross-coupled latching arrangement. The cross-coupled latch represented by the NAND gate 1016 and the inverter 1018 is controlled to hold a one value as a result of the low-to-high transition on the data-in signal 1010 through the use of inverter 1020. Neither the NAND gate 1016 or the inverter 1018 directly drive the data-out signal 1012 and may be advantageously designed with respect to various factors, such as timing of state changing events, device performance, and device physical implementation size. The reset element 1008 comprises two serially coupled transistors 1024 and 1026 that respond to the data-in signal 1010, buffered by inverter 1020, and to a clock signal 1030, respectively. The reset element 1008 is also separate from the output driving stage of the one catcher circuit 1000 and may be advantageously designed with respect to various factors, such as timing of state changing events, device performance, and device physical implementation size.

A zero catcher circuit will generally be used when the falling edge of the data-in signal is more timing critical than the rising edge of the data-in signal. If the rising edge of the data-in signal is more timing critical, a one catcher circuit will generally be used. In dynamic logic circuits, the use of a zero catcher circuit will, many times, be found to improve timing performance over the use of a one catcher circuit.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic components, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, for example, a combination of a DSP and a microprocessor, a plurality of microprocessors, one or more microprocessors in conjunction with a DSP core, or any other such configuration appropriate for a desired application.

The methods described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

While the invention is disclosed in the context of illustrative embodiments for instruction caches, data caches, and other types of caches, it will be recognized that a wide variety of implementations may be employed by persons of ordinary skill in the art consistent with the above discussion and the claims which follow below.

What is claimed is:

1. A logic state catching circuit comprising:
   a logic circuit with a first input, a second input, and an output, the logic circuit configured to respond to a change in state of a data value coupled to the first input causing a representative value of the data value to be generated on the output, the second input receiving a latched version of the data value to hold the representative value on the output after the data value has returned to its original state;
   a latching element configured to respond to the change in state of the data value by latching the data value and to couple the latched version of the data value to the second input; and
   a reset element enabled by the data value when the data value changes state, the enabled reset element configured to respond to a change in state of a clock input by resetting the latching element.

2. The logic state catching circuit of claim 1 wherein the change in state of the clock input occurs prior to the change in state of the data value.

3. The logic state catching circuit of claim 1 wherein the latching circuit comprises:
   a latch arrangement of logic elements with a control input for setting a one value in the latch and a control input for setting a zero value in the latch.

4. The logic state catching circuit of claim 3 wherein the reset circuit comprises:
   a gated device enabled by the data value coupled to the first input and controlled by a clock input during a predefined period which causes the gated device to generate a reset signal used as one of the control inputs to the latching element.

5. The logic state catching circuit of claim 4 wherein the clock input is delayed adjusting the reset timing to begin just prior to the data-in signal changing state from an initial state to a state desired to be caught in the logic state catching circuit and to end just prior to the data-in signal returning to the initial state.

6. The logic state catching circuit of claim 1 wherein the logic circuit coupled with the latching element coupled with the reset circuit comprises a zero catcher circuit.

7. The logic state catching circuit of claim 1 wherein the logic circuit coupled with the latching element coupled with the reset circuit comprises a one catcher circuit.

8. The logic state catching circuit of claim 1 wherein the logic circuit is designed in size to meet the fan out of the output path.

9. The logic state catching circuit of claim 3 wherein the latch arrangement of logic elements are designed in size to be less than half the size of the logic circuit.

10. The logic state catching circuit of claim 4 wherein the gated device is designed in size to be less than 75% the size of the logic circuit.

11. A method for catching a logic state comprising:
resetting a latching element of a logic state catching circuit during a predefined period;
driving within one stage of logic a change in state of a data-in signal on an output of the logic state catching circuit;
latching the latching element to the logic state of the data-in signal in response to the change in state of the data-in signal;
using an output of the latching element to hold the output state of the output of the logic state catching circuit; and
holding the latched logic state of the data-in signal until a clock transitions to a state that holds the latching element in a reset state.

12. The method of claim 11 wherein the resetting of the latching element occurs prior to the change in state of the data-in signal and the latching of the latching element to the changed state of the data-in signal occurs before the predefined period ends.

13. The method of claim 11 further comprises:
enabling a resetting element of the logic state catching circuit in response to a clock transition to a state allowing the catching of a logic state in the logic state catching circuit.

14. The method of claim 13 further comprises:
adjusting an arrival time of the clock transition to be equal to at least the delay of one logic inverter having a fanout loading of one standard logic gate prior to the change in state of the data in signal.

15. The method of claim 11 further comprises:
adjusting the pulse width of the clock at least the delay of the pulse width of the data-in signal plus the delay of one logic inverter having a fanout loading of one standard logic gate.

16. A logic state catching circuit comprising:
a logic circuit with a first input, a second input, and an output, the logic circuit configured to respond to a change in state of a data value coupled to the first input causing a representative value of the data value to be generated on the output, the second input receiving a latched version of the data value to hold the representative value on the output after the data value has returned to its original state;
a latching element configured to respond to the change in state of the data value by latching the data value and to couple the latched version of the data value to the second input; and
a reset element configured to hold the latching element in a reset state until a clock changes state allowing the latching element to respond to the change in state of the data value.

17. The logic state catching circuit of claim 16 wherein the latching circuit comprises:
a latch arrangement of logic elements with a control input for setting a one value in the latch and a control input for setting a zero value in the latch.

18. The logic state catching circuit of claim 17 wherein the reset circuit comprises:
a gated device controlled by the clock during a predefined period which causes the gated device to generate a reset signal used as one of the control inputs to the latching element.

19. The logic state catching circuit of claim 18 further comprising:
a clock control circuit for controlling the arrival time of the clock in relation to the change in state of the data value and the pulse width of the clock.

* * * * *

UNITED STATES PATENT AND TRADEMARK OFFICE
CERTIFICATE OF CORRECTION

PATENT NO. : 7,564,266 B2  Page 1 of 1
APPLICATION NO. : 11/767740
DATED : July 21, 2009
INVENTOR(S) : Ge et al.

It is certified that error appears in the above-identified patent and that said Letters Patent is hereby corrected as shown below:

Column 14, line 5, claim 14: "data in" to read as --data-in--

Signed and Sealed this
Thirty-first Day of May, 2011

David J. Kappos
*Director of the United States Patent and Trademark Office*